United States Patent [19]
Lii et al.

[11] Patent Number: 5,936,838
[45] Date of Patent: Aug. 10, 1999

[54] MPC MODULE WITH EXPOSED C4 DIE AND REMOVAL THERMAL PLATE DESIGN

[75] Inventors: Mirng-Ji Lii; Gregory Turturro; Chia-Pin Chiu, all of Chandler, Ariz.

[73] Assignee: Intel Corporation, Santa Clara, Calif.

[21] Appl. No.: 08/972,216

[22] Filed: Nov. 18, 1997

[51] Int. Cl.$^6$ ..................................................... H05H 7/20

[52] U.S. Cl. ..................... 361/705; 174/15.2; 174/16.3; 361/700; 361/715

[58] Field of Search ................................. 165/80.2, 80.3, 165/104.33, 185; 174/16.3, 15.2; 257/706–707, 712–713, 715; 361/687, 690, 700, 704–710, 714–716, 719–720, 748

[56] References Cited

U.S. PATENT DOCUMENTS 5,424,913  6/1995  Swindler .................................. 361/690

*Primary Examiner*—Gregory Thompson
*Attorney, Agent, or Firm*—Blakely, Sokoloff, Taylor & Zafman

[57] ABSTRACT

An electronic assembly which has a ring that creates a dam for a thermal grease. The assembly may include an integrated circuit which is mounted to a substrate. The assembly may also include a cover which has an opening that exposes the integrated circuit. The ring is coupled to the integrated circuit and the cover. A thermal element may be placed adjacent to the integrated circuit and the thermal grease. The dam controls the flow of the thermal grease. The opening allows the thermal element to be placed adjacent to the integrated circuit. In one embodiment the thermal element may be attached to the cover by a hinge. The hinge thermal element may compensate for tolerances in the assembly without creating excessive forces on the integrated circuit.

14 Claims, 2 Drawing Sheets

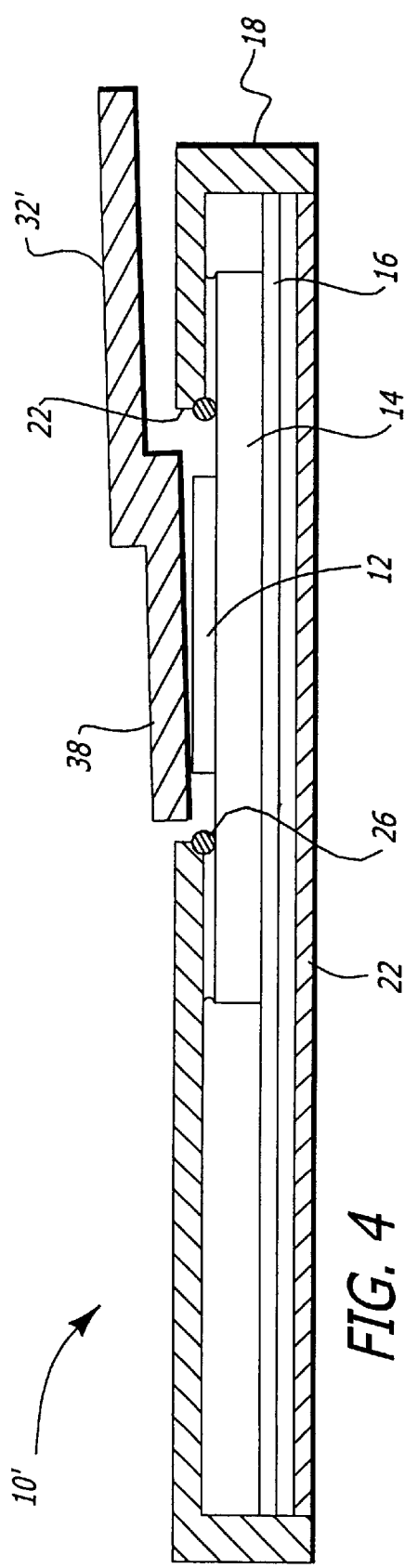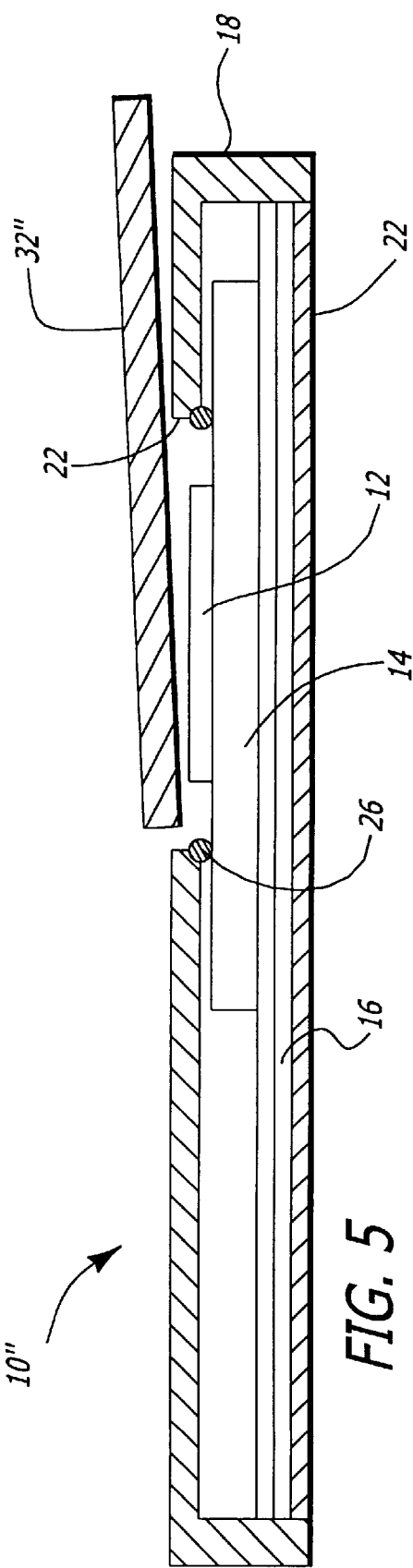

MPC MODULE WITH EXPOSED C4 DIE AND REMOVAL THERMAL PLATE DESIGN

BACKGROUND OF THE INVENTION

1. Field of the Invention

The present invention relates to an electronic assembly for an integrated circuit.

2. Background Information

Integrated circuits are assembled into packages that are soldered to printed circuit boards. The printed circuit board is typically plugged into a motherboard that is part of a computer system. The integrated circuit generates heat which must be removed to insure that the junction temperatures of the circuit are within operating limits.

Most of the heat generated by the circuit flows into the ambient through the package. The package is typically constructed from a dielectric material such as plastic which has a relatively low coefficient of thermal conductivity. Consequently, the package can create an undesirable temperature differential between the ambient and the integrated circuit.

Some electronic packages incorporate a thermal element such as a heat slug or a heat pipe to provide a conductive path for the heat generated by the integrated circuit. It is desirable to assemble the thermal element into contact with the integrated circuit to minimize the thermal resistance between the two components. It has been found that some integrated circuits have a convex curvature. The curvature may create a space between the circuit and the thermal element. Additionally, tolerances in the assembly may also create a space between the thermal element and the integrated circuit.

Some packages contain a thermal grease which fills the space(s) between the integrated circuit and the thermal element. The thermal grease has a higher thermal conductivity than air. Even with a thermal grease the integrated circuit/thermal element interface may create an undesirable temperature drop which increases the junction temperature of the integrated circuit. It would be desirable to provide an electronic assembly which compensates for tolerances in the assembly to minimize the thermal resistance between an integrated circuit and a thermal element.

Thermal elements such as heat slugs, heat sinks, heat pipes, etc. are typically constructed from a metal material such as aluminum. The metal may create a relatively heavy mass which exerts a force onto the integrated circuit and package when the assembly is subjected to external shock and vibration loads. It would be desirable to provide an electronic assembly that is thermally efficient and does not create a large weight load on the package.

SUMMARY OF THE INVENTION

One embodiment of the present invention is an electronic assembly which has a ring that creates a dam for a thermal grease. The assembly may include an integrated circuit which is mounted to a substrate. The assembly may also include a cover which has an opening that exposes the integrated circuit. The ring is coupled to the integrated circuit and the cover. A thermal element may be placed adjacent to the integrated circuit and the thermal grease.

BRIEF DESCRIPTION OF THE DRAWINGS

FIG. 4 is a side view of an alternate embodiment of the electronic assembly;

FIG. 5 is a side view of an alternate embodiment of the electronic assembly.

DETAILED DESCRIPTION OF THE INVENTION

One embodiment of the present invention is an electronic assembly which has a ring that creates a dam for a thermal grease. The assembly may include an integrated circuit which is mounted to a substrate. The assembly may also include a cover which has an opening that exposes the integrated circuit. The ring is coupled to the integrated circuit and the cover. A thermal element may be placed adjacent to the integrated circuit and the thermal grease.

The dam controls the flow of the thermal grease. The opening allows the thermal element to be placed adjacent to the integrated circuit. In one embodiment the thermal element may be attached to the cover by a hinge. The hinged thermal element may compensate for tolerances in the assembly without creating excessive forces on the integrated circuit. Attaching the thermal element to the cover also mechanically decouples the element from the integrated circuit and reduces the weight load on the circuit when the assembly is subjected to external shock and/or vibration loads.

Figure 1:
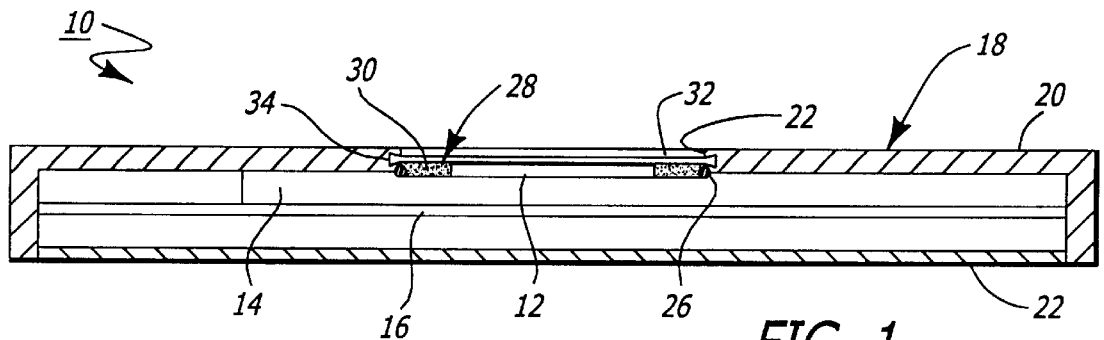
FIG. 1 is a side view of an electronic assembly of the present invention.
Figure 2:
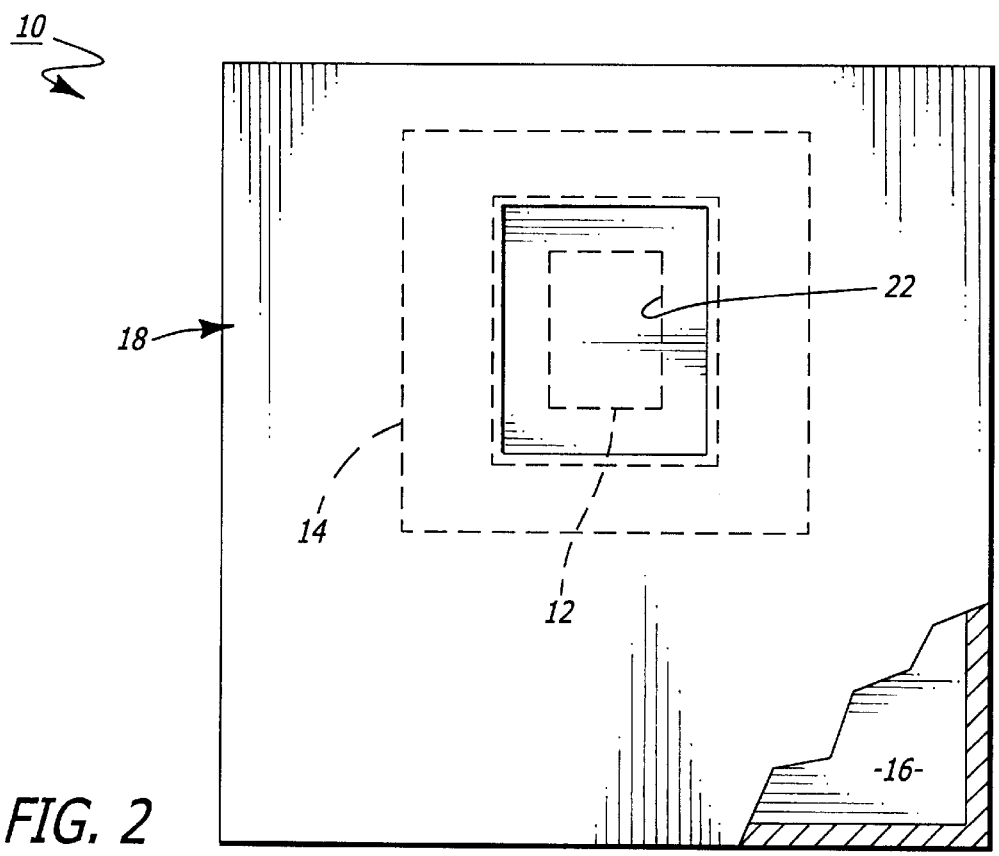
FIG. 2 is a top view of the electronic assembly shown in FIG. 1.

Referring to the drawings more particularly by reference numbers, FIGS. 1 and 2 show an electronic assembly 10 of the present invention. The assembly 10 may include an integrated circuit 12 that is mounted to a substrate 14. The substrate 14 may be attached to a printed circuit board 16. The substrate 14 may contain bond pads, routing traces, vias and external contacts that electrically couple the integrated circuit 12 to the printed circuit board 16. By way of example, the substrate 14 may be constructed with known printed circuit board or ceramic processes.

The integrated circuit 12 may be coupled to the substrate 14 by a process known as C4. In a C4 process the integrated circuit 14 contains solder bumps that are reflowed onto surface pads (not shown) of the substrate 14.

The assembly 10 may include a cover 18 that is attached to the printed circuit board 16. The cover 18 may include a top component 20 and a bottom component 21 that are assembled to enclose the circuit board 16. The top component 20 of the cover 18 may contain an opening 22 which exposes the integrated circuit 12.

The assembly 10 may have a ring 26 that is coupled to the substrate 14 and the cover 18. The ring 26 may be constructed from an elastomeric material that will compensate for tolerances between the cover/substrate assembly. By way of example, the ring 26 may be a rubber O-ring. The ring 26 creates a dam 28 about the integrated circuit 12. A thermal grease 30 can be inserted into the dam 28. The ring 26 controls the flow of the thermal grease 30 and creates a known dam volume so that a predetermined volume of grease 30 can be injected into the dam 28 during a manufacturing process. Injecting a predetermined volume of grease 30 into a defined dam space may insure that the dam 30 is always filled with grease to improve the quality of mass produced packages. Although a thermal grease 30 is described, it is to be understood that the dam 28 may be filled with a thermal epoxy or other thermally conductive material that can be injected into the dam.

The assembly 10 may further include a thermal element 32 that is located within the opening 22 adjacent to the integrated circuit 12 and the thermal grease 30. The thermal element 32 is typically separated from the integrated circuit 12 by the thermal grease 30, although it is to be understood that some or all of the element 32 may be in direct contact with the circuit 12. The thermal element 32 may be constructed from a lightweight thermally conductive material such as aluminum.

Figure 3A:
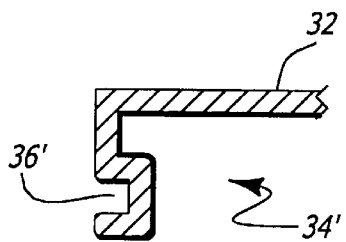
FIG. 3a is an enlarged view showing an alternate embodiment of a hinge of the assembly.
Figure 3B:
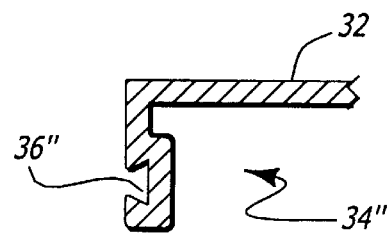
FIG. 3b is an enlarged view showing an alternate embodiment of a hinge of the assembly.

The thermal element 32 may be a heat plate that is attached to the cover 18 by a hinge 34. The hinge 34 may allow the element 32 to bend relative to the cover 18. The hinged plate can compensate for tolerances in the height of the printed circuit board 16, the substrate 14, the integrated circuit 12 and the cover 18. The hinge 34 may be molded into the cover 18 as shown in FIG. 1. Alternatively, as shown in FIG. 3a, the hinge 34' may have a notch 36 that snaps onto a corresponding tab (not shown) of the cover 18. As another alternate embodiment, the hinge 34" may have a dovetail shaped notch 36" as shown in FIG. 3b.

FIG. 4 shows an alternate embodiment of an assembly 10' which includes a thermal element 32' that is not attached to the cover 18. The thermal element 32' may be a heat pipe which has one end fastened to a fixture within a computer assembly (not shown) and an opposite end 38 that extends into the opening 22 of the cover 18. End 38 may have a step that allows the element 32' to extend into the opening 22 of the cover 18 parallel to the integrated circuit 12. The thermal element 32' is mechanically decoupled from the integrated circuit 12 so that the element 32' does not exert a weight load onto the circuit 12 when the assembly 10' is subjected to external shock and/or vibration loads.

FIG. 5 shows an alternate embodiment of an assembly 10" which has a thermal element 32" that extends into the opening 22 at an angle relative to the cover 18. The angle allows a manufacturer to adjust the depth that the element 32' is inserted into the opening 22 to compensate for tolerances in the assembly.

The assemblies 10, 10' or 10" can be assembled by initially attaching the integrated circuit 12 to the substrate 14 and mounting the substrate 14 to the printed circuit board 16. The cover 18 can be attached to the printed circuit board 16 and the substrate 14. The ring 26 can be located within the opening 22 to form the dam 28. A thermal grease 30 can be injected into the dam 28. The thermal element 32 is then placed adjacent to the integrated circuit 12 to complete the assembly 10.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, the ring 26 may be placed onto the substrate 14 before the cover 18 is attached to the printed circuit board 16.

What is claimed is:

1. An electronic assembly, comprising:

a substrate;

an integrated circuit mounted to said substrate;

a cover which has an opening that exposes said integrated circuit;

a ring coupled to said cover and said substrate and which creates a dam about said integrated circuit;

a thermal grease located within said dam; and, a thermal element located adjacent to said integrated circuit and said thermal grease.

2. The assembly as recited in claim 1, wherein said ring is constructed from an elastomeric material.

3. The assembly as recited in claim 1, wherein said thermal element is a heat pipe.

4. The assembly as recited in claim 1, wherein said thermal element extends into said opening at an angle relative to said cover.

5. The assembly as recited in claim 1, further comprising a printed circuit board that is attached to said substrate.

6. The assembly as recited in claim 1, wherein said thermal element is attached to said cover.

7. The assembly as recited in claim 6, wherein said thermal element is attached to said cover by a hinge.

8. The assembly as recited in claim 7, wherein said hinge includes a dovetail notch.

9. An electronic assembly, comprising:

a substrate;

an integrated circuit mounted to said substrate;

a cover which has an opening that exposes said integrated circuit;

a ring that is coupled to said cover and said substrate and which creates a dam about said integrated circuit;

a thermal grease that is located within said dam; and, a thermal element that is located in said opening and attached to said cover by a hinge.

10. The assembly as recited in claim 9, wherein said ring is constructed from an elastomeric material.

11. The assembly as recited in claim 10, wherein said thermal element is a heat pipe.

12. The assembly as recited in claim 11, further comprising a printed circuit board that is attached to said substrate.

13. A method for assembling an electronic assembly, comprising:

a) mounting an integrated circuit to a substrate;

b) placing said integrated circuit into an opening of a cover;

c) placing a ring within said opening wherein said ring surrounds an area of said integrated circuit;

d) inserting a thermal grease into said surrounded area of said integrated circuit; and, e) placing a thermal element adjacent to said integrated circuit and said thermal grease.

14. The method as recited in claim 13, wherein said thermal element is attached to said cover in step (e).

* * * * *